United States Patent
Gardner (10) Patent No.: US 6,466,803 B1
(45) Date of Patent: Oct. 15, 2002

(54) MULTI-MODE COMMUNICATIONS SYSTEM WITH EFFICIENT OSCILLATOR SYNCHRONIZATION

(75) Inventor: William R. Gardner, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/420,891

(22) Filed: Oct. 19, 1999

(51) Int. Cl.[7] ............................................. H04B 1/38
(52) U.S. Cl. ..................... 455/553; 455/334; 455/260; 375/355
(58) Field of Search ................................ 455/553, 414, 455/550, 436, 130, 132, 136, 334, 260; 375/355

(56) References Cited

U.S. PATENT DOCUMENTS

| | | | |
|---|---|---|---|
| 4,731,796 A | * 3/1988 | Masterton et al. | 375/9 |
| 5,375,145 A | * 12/1994 | Abbott et al. | 375/98 |
| 5,614,904 A | * 3/1997 | Dent | 341/143 |
| 5,745,484 A | * 4/1998 | Scott | 370/347 |
| 5,887,020 A | * 3/1999 | Smith et al. | 375/200 |
| 5,903,600 A | 5/1999 | Lee | 375/219 |
| 6,115,595 A | * 9/2000 | Rodal et al. | 455/333 |

FOREIGN PATENT DOCUMENTS

| | | | |
|---|---|---|---|
| WO | 9926336 | 5/1999 | H03D/7/16 |

\* cited by examiner

*Primary Examiner*—Thanh Cong Le
*Assistant Examiner*—Thuan T. Nguyen
(74) *Attorney, Agent, or Firm*—Philip R. Wadsworth; Charles D. Brown; Howard H. Seo (57) ABSTRACT

A system for synchronizing a second receive chain relative to a first receive chain in a multi-mode communication system. The system includes a first circuit that measures a first frequency associated with the first receive chain. A second circuit adjusts a second frequency associated with the second receive chain based on the first frequency and provides a desired second frequency to the second receive chain in response thereto. In a specific embodiment, the first circuit includes a first counter that receives a signal associated with an output of a first oscillator and provides a measurement of the first frequency in response thereto. The second circuit includes a frequency synthesizer for providing the desired second frequency in response to a frequency control or reference signal. Another circuit generates the control or reference signal based on a difference between the second frequency and the first frequency. A second counter receives a signal characterized by the second frequency and provides the second frequency in response thereto.

18 Claims, 3 Drawing Sheets

MULTI-MODE COMMUNICATIONS SYSTEM WITH EFFICIENT OSCILLATOR SYNCHRONIZATION

BACKGROUND OF THE INVENTION

1. Field of Invention

This invention relates to communications systems. Specifically, the present invention relates to multi-mode communications systems employing methods for synchronizing and controlling oscillators to facilitate handoff.

2. Description of the Related Art

Many wireless phones accommodate both a digital communications standard as well as an analog communications standard. Wireless phones that accommodate more than one wireless communications standards are multi-mode phones.

Many wireless phones integrate digital Code Division Multiple Access (CDMA) capabilities with analog Advanced Mobile Phone System (AMPS) capabilities. Incorporating both the digital CDMA and analog AMPS standards in one wireless phone expands effective user coverage area. For example, a user with a multi-mode phone incorporating both analog and digital systems can effectively communicate in areas lacking digital coverage.

As wireless communications technology progresses, so do the numbers of digital standards. Currently, the digital standards CDMA and Global System for Mobile communications (GSM) are in widespread use. Digital systems are often preferable to analog systems as they generally provide higher quality, higher capacity and improved security features.

Unfortunately, existing phones typically incorporate only one digital standard and, as a result, their coverage area is limited. Wireless phones incorporating multiple digital standards have been slow to develop due to various obstacles. For example, wireless digital communications systems often require oscillator synchronization to lock on to a received signal. For a wireless phone to efficiently handoff from one digital system to another, novel and unique oscillator synchronization methods must be employed to avoid significant delay and/or dropped calls during system handoff. In addition, oscillators employed in wireless communication systems may drift over time. Digital communications systems employing multiple oscillators must account for additional frequency drift associated with the additional oscillators to effectively receive signals As international commerce and tourism expands, the demand for wireless phones that can accommodate more than one digital standard also increases. For example, currently people traveling between the United States and Europe, which operate under different digital wireless communications standards, must carry a separate phone for each standard. This is often expensive and inefficient.

Hence, a need exists in the art for multi-mode communications device that can efficiently accommodate more than one digital standard. There is a further need for a system and method for facilitating oscillator synchronization to enable efficient handoff between communications systems employing different digital standards.

SUMMARY OF THE INVENTION

The need in the art is addressed by the system for synchronizing a second receive chain relative to a first receive chain in a digital multi-mode communications system of the present invention. In the illustrative embodiment, the inventive system is adapted for use with CDMA and GSM digital communications system standards and includes a first circuit for determining a first frequency associated with the first receive chain. A second circuit adjusts a second frequency associated with the second receive chain based on the first frequency and provides a desired second frequency to the second receive chain in response thereto.

In a specific embodiment, the first circuit includes a first counter that receives a signal associated with an output of a first oscillator and provides a measurement of the first frequency in response thereto. The second circuit includes a frequency synthesizer for providing the desired second frequency in response to a frequency control or reference signal. The frequency synthesizer may be implemented as a phase-locked loop, a direct digital synthesizer, and/or a frequency-controllable oscillator. The second circuit also includes a circuit for generating the control or reference signal based on a difference between the second frequency and the first frequency. A second counter receives a signal characterized by the second frequency and provides the second frequency in response thereto.

In the preferred embodiment, the second circuit includes a circuit for generating the control or reference signal based on a difference between the second frequency and the first frequency, where the first frequency corresponds to a first count of the number of cycles occurring in a signal of the first frequency during a specific time interval, and where the second frequency corresponds to a second count of the number of cycles occurring in a signal of the second frequency during the specific time interval. The specific time interval represents the time required for the first counter to count to a desired first count. The desired second count is the number of cycles of the signal of the second frequency occurring during the specific time interval as counted by a second counter. The second circuit includes a subtractor for subtracting the second count from a desired second count, which provides an error signal in response thereto. The second circuit includes a frequency tuner for providing the control or reference signal to the frequency synthesizer or the first oscillator, where the control or reference signal is based on the error signal.

In an alternative embodiment, the difference between the second frequency and the first frequency is the difference between the ratio of the first frequency to the second frequency and a predetermined desired ratio of the first frequency to the second frequency.

The novel design of the present invention is facilitated by use of the second circuit that synchronizes the second frequency relative to the first frequency. The first frequency is already actively tuned based on received signals from a first digital communications system by pre-existing oscillator tuning circuitry. By employing the tuned first frequency and a desired known relationship between the first frequency and second frequency, the second circuit pre-tunes the second frequency. As a result, multi-mode communications systems, and in particular, digital multi-mode communications systems constructed in accordance with the teachings of the present invention can efficiently handle handoff between digital systems employing different reference oscillator frequencies.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The following review of a conventional wireless digital phone is intended to facilitate an understanding of the present invention.

Figure 1:
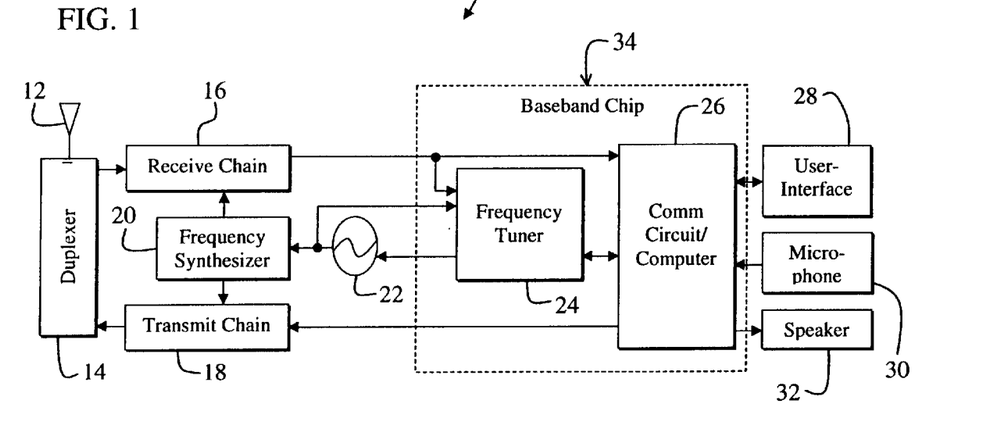
FIG. 1 is a diagram of a conventional wireless communications device.

FIG. 1 is a diagram of a conventional wireless digital phone 10. The wireless digital phone 10 includes an antenna 12 connected to a duplexer 14. The duplexer 14 is connected to an input of a receive chain 16 and an output of a transmit chain 18. A frequency synthesizer 20 is connected to an input of the receive chain 16, an input of the transmit chain 18, and to an output of a tunable oscillator 22. An output of the oscillator 22 is connected to the frequency synthesizer 20 and a frequency tuner 24. An output of the frequency tuner 24 is connected to an input of the oscillator 22.

An output of the receive chain 16 is connected to an input of the frequency tuner 24 and to an input of a communications circuit/computer 26. An output of the communications circuit/computer 26 is connected to the transmit chain 18. The communications circuit/computer 26 is also connected to a user-interface 28, a microphone 30, and a speaker 32. The frequency tuner 24 and the communications circuit/computer 26 are digital circuits and implemented on a baseband chip 34.

In operation, radio signals received by the antenna 12 are transferred to the duplexer 14, which directs the received signal to the receive chain 16. The receive chain 16 converts the received radio frequency (RF) signals to intermediate frequency (IF) signals via down-converters and mixers (not shown) and subsequently to digital baseband signals in preparation for digital processing on the baseband chip 34. The oscillator 22 and the frequency synthesizer 20 facilitate accurate translation of the received RF signals to the desired IF frequency band and facilitate lock-on of the received RF signals by the receive section 16. The receive chain 16 also includes filters, amplifiers and automatic gain control circuitry (not shown) to further prepare received signals for processing.

Typically, a base station (not shown) associated with a digital communications system broadcasts a pilot or beacon signal detectable by the receive section 16. The receive section 16 employs a portion of the pilot or beacon signal to facilitate tuning of the oscillator 22 to an appropriate frequency via the frequency tuner 24 as specified via the pilot or beacon signal.

Similarly, transmit chain 18 converts digital baseband signals, such as voice signals input via the microphone 30 and encoded via the communication circuit/computer 30, to radio frequency signals via a reference frequency output from the frequency synthesizer 20 and one or more frequency up-converters and mixers (not shown).

When the digital phone 10 is turned on via the user interface 28, the initial frequency of the oscillator 22 may be erroneous due to frequency drift caused by temperature, aging, and other factors. The frequency tuner 24 tunes the output frequency of the oscillator 22 so that it is sufficiently close to the desired frequency. For example, for GSM systems, the oscillator 22 may be set at 13.00 MHz nominally but might drift by 100 Hz. Tuning of the oscillator 22 via the frequency tuner 24 can significantly reduce frequency error and improve the performance of the digital phone 10.

The digital phone 10 can accommodate only one wireless digital communications system such as a CDMA system. As a result, the coverage area of the wireless digital phone 10 is limited.

Figure 2:
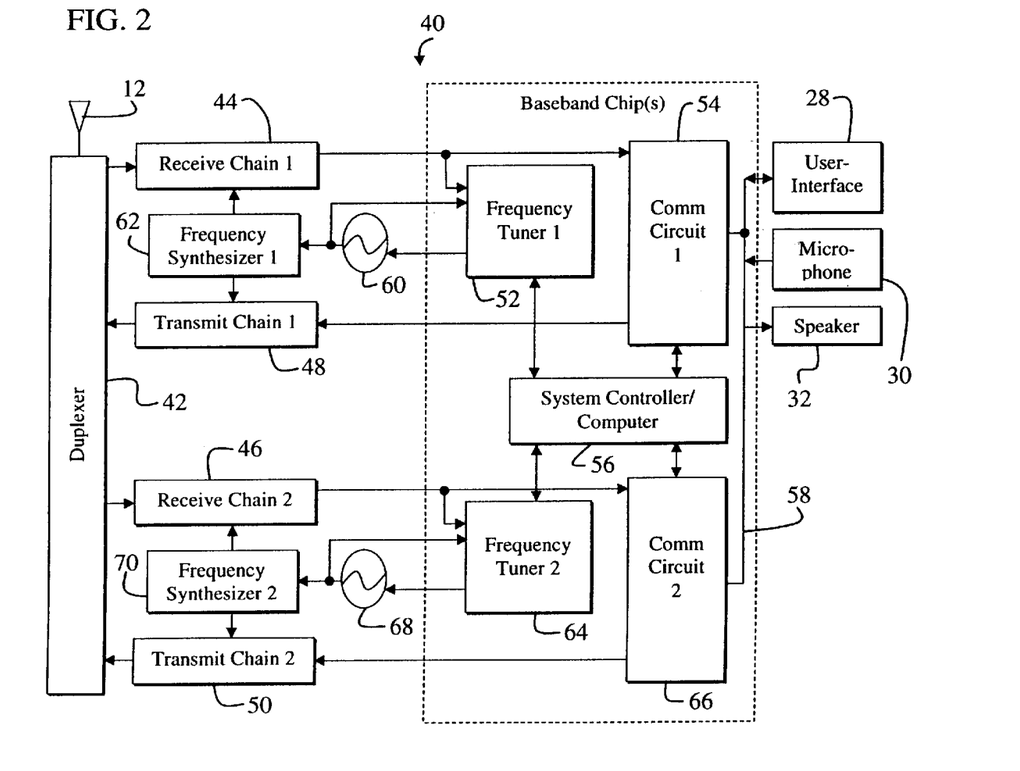
FIG. 2 is a diagram of a multi-mode wireless communications device of the present invention.

FIG. 2 is a diagram of a multi-mode wireless communications device 40 of the present invention. For clarity, additional circuitry such as automatic gain control circuitry, filters, amplifiers, isolators, encoders, and decoders have been omitted from FIG. 2. Those ordinarily skilled in the art will know where and how to implement the additional circuitry.

The wireless communications device 40 includes the antenna 12 connected to an expanded duplexer 42. The expanded duplexer 42 is connected to an input of a first receive chain 44, an input of a second receive chain 46, an output of a first transmit chain 48, and an output of a second transmit chain 50.

The expanded duplexer 42 implements a switch that directs either the output of the first transmit chain 48 or the output of the second transmit chain 50 to the antenna 12 if the first transmit chain 48 or the second transmit chain 50 is active, respectively, as indicated via a control signal (not shown) from the system controller/computer 56. Those skilled in the art will appreciate that the expanded duplexer 42 may be implemented with two duplexers, one for the first receive chain 44 and transmit chain 48, and one for the second receive chain 46 and transmit chain 50 without departing from the scope of the present invention.

An output of the first receive chain 44 is connected to an input of a first frequency tuner 52 and to a first communications circuit 54. An input of the transmit circuit 48 is connected to an output of the first communications circuit 54. The first communications circuit 54 is also connected to a system controller/computer 56 and a bus 58 that is connected to the user-interface 28, the microphone 30, and the speaker 32. An output of the first frequency tuner 52 is connected to the first oscillator 60. An output of the first oscillator 60 is connected to an input of the first frequency tuner 52 and to an input of a first frequency synthesizer 62. A first output of the first frequency synthesizer 62 is connected to an input of the first receive chain 44. A second output of the first frequency synthesizer 62 is connected to an input of the first transmit chain 48.

An output of the second receive chain 46 is connected to an input of a second frequency tuner 64 and to a second communication circuit 66. The second communications circuit 66 is also connected to the bus 58 and to an input of the second transmit chain 50. An output of the second frequency tuner 64 is connected to a second oscillator 68, an output of which is connected to an input of a second frequency synthesizer 70 and to an input of the second frequency tuner 64. A first output of the second frequency synthesizer 70 is connected to an input of the second receive chain 46. A second output of the second frequency synthesizer 70 is connected to an input of the second transmit chain 50. In the present specific embodiment, the outputs of the second frequency synthesizer 70 are equivalent and provide equivalent signals to the second transmit chain 50 and the second receive chain 46.

The communications device 40 facilitates the establishment of a communications link (not shown) between the communications device 40 and an external communications system such as a GSM or CDMA communications system. Once the device 40 locks on to a GSM signal or a CDMA signal from a GSM system or CDMA system, respectively, and synchronizes the appropriate oscillators 60 and 68 and/or synthesizers 62 and 70, the device 40 establishes a communications link such as a voice link or data link via methods known in the art.

In operation, software running on the system controller/computer 56 determines whether the wireless communications device 40 is operating in a region associated with a first communications system or a second communications system or both (not shown) and activates the first communications circuit 54 and associated circuitry 44, 62, 48, 60, and 52, or the second communications circuit 66 and associated circuitry 46, 70, 50, 68, 64 in response thereto. The determination of the active communications system may be made via Global Positioning System (GPS) position detection equipment and circuitry as disclosed in co-pending U.S. patent application Ser. No. 09/187,939, filed Nov. 6, 1998, by QUALCOMM Incorporated, entitled MOBILE COMMUNICATION SYSTEM WITH POSITION DETECTION TO FACILITATE HARD HANDOFF, the teachings of which are incorporated herein by reference. The determination may also be made via the reception of a pilot signal indicative of the first or second communications system.

In the present specific embodiment, the receive chain 44 or 46 to first lock-on to a signal transmitted by a communications system determines the active communications system. For example, if the first receive chain 44 locks-on first to a communications signal, then the wireless communications device 40 is operating in a region associated with a first communications system, for which the first receiver chain 44 is adapted. If the second receiver chain 46 locks-on first, then the second communications system is available and is employed by the wireless communications device 40. In the present specific embodiment, the first communications system is a CDMA communications system, and the second communications system is a GSM system.

The operation of the multi-mode communications device 40 is similar to the operation of the communications device of FIG. 1 with the exception that the multi-mode communications device 40 can handle two different types of wireless digital communications systems and includes the system controller/computer 56 that runs software to facilitate the switching of phone resources between different communications systems.

When the first receive chain 44 initially receives a signal transmitted by a CDMA communications system such as a CDMA base station, the first frequency tuner 52 adjusts the frequency of the first oscillator 60 in accordance with the received CDMA signal via methods known in the art. The first frequency synthesizer 62 subsequently adjusts the frequency of the signal input to the first receive chain 44 and the first transmit chain 48.

Similarly, when the second receive chain 44 initially receives a signal transmitted by an external GSM communications system such as a GSM base station, the second frequency tuner 64 adjusts the frequency of the second oscillator 68 in accordance with the received GSM signal via methods known in the art. The second frequency synthesizer 70 subsequently adjusts the frequency of the signal input to the second receive chain 46 and the second transmit chain 50.

If the digital communications device 40 is traveling in a region characterized by both the CDMA and GSM systems, the first locked-on system is the active system. Those skilled in the art will appreciate that a different method for choosing the active system may be employed without departing from the scope of the present invention. For example, software running on the system controller/computer 56 may establish a priority between digital communications systems in regions covered by both the CDMA and the GSM communications systems.

When the device 40 is handed off between CDMA and GSM systems, a delay may occur as the first receiver chain 44 or the second receive chain 46 locks-on to the digital communications system that the device 40 is being handed off to. For example, if the currently active system, which includes a transceiver (not shown) that is external to the device 40, is a CDMA communications systems, when the device 40 nears the end of the CDMA coverage area and enters a GSM coverage area, the CDMA signal is lost by the receive chain 44. The GSM signal is picked up by the second receive chain 46 and the frequency of the second oscillator 68 is set such that the frequency produced by the second frequency synthesizer 70 is matched to the frequency of the received RF signal.

As discussed more fully below, the present invention includes a unique oscillator synchronization system and method to facilitate system acquisition or intersystem handoff from one digital communications system to another such as from a CDMA system to a GSM system.

Intersystem handoff is typically employed when two telecommunication systems are adjacent to one another and the neighboring system is better able to serve the wireless communications device than the current serving system. The neighboring system and the serving system must have contiguous serving areas. Intersystem handoff can take place between two systems using the same air interface or between two systems using two different air interfaces.

An acquisition or handoff from one type of digital communications system to another type of digital communications system is expedited by tuning circuitry, as discussed more fully below, that tunes the frequency of the second oscillator 68 to approximately match that of the second digital communications system frequency. This is accomplished by tuning the second oscillator 68 until a desired number of cycles of the output signal from the second oscillator 68 is counted in a given number of cycles of the output signal from the first oscillator 60. For example, if a CDMA system (external to the device 40) with an oscillator frequency of 19.68 MHz is initially acquired by the device 40, but a GSM system is not yet acquired, then the number of GSM oscillator cycles (cycles of the second oscillator 68) occurring during every 19.68 million CDMA oscillator cycles (cycles of the first oscillator 60) is counted. If 13.00 million cycles occurred, the GSM oscillator 68 is tuned, since the desired GSM frequency is approximately 13.00 MHz. If more or less than 13.00 million cycles are measured, the GSM oscillator 68 is tuned to increase or decrease the frequency of the GSM oscillator 68 until 13.00 million cycles are measured. In this way, the GSM oscillator 68 is tuned to the correct frequency before reception of the GSM signal is attempted. This allows for rapid acquisition and handoff from the CDMA system to the GSM system and visa-versa.

Figure 3:
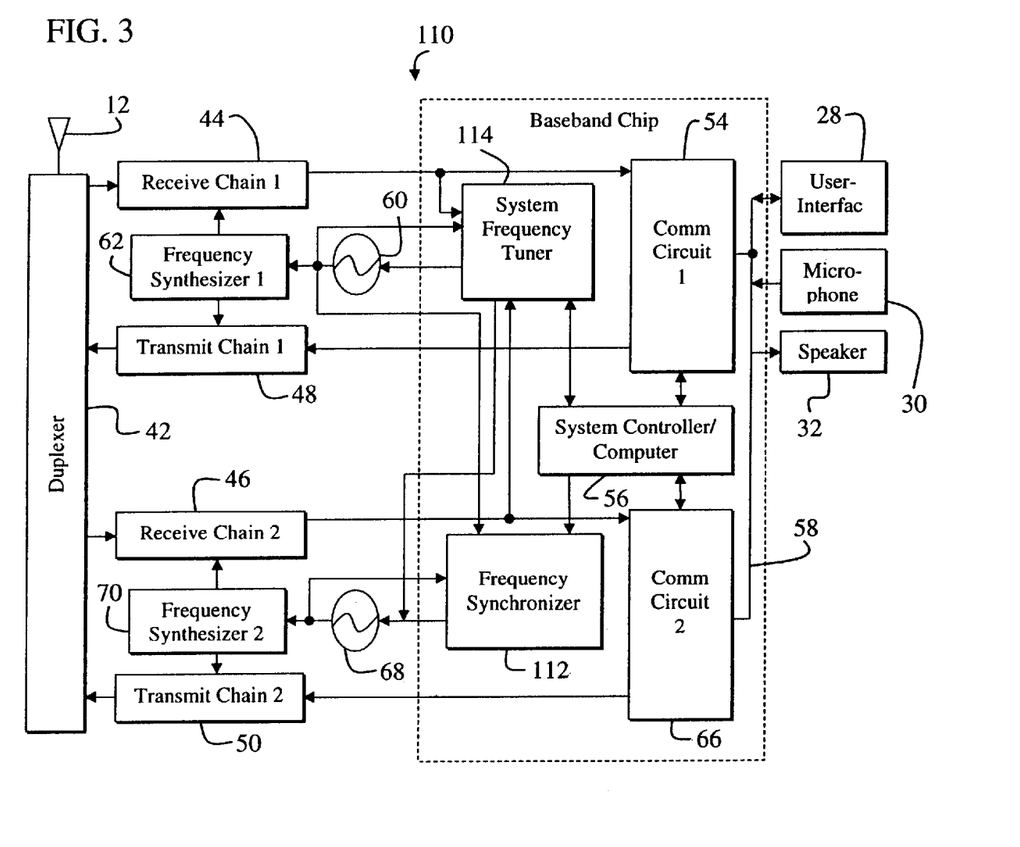
FIG. 3 is a diagram of a multi-mode wireless communications device employing a unique frequency synchronizer to facilitate handoff between digital communications systems.

FIG. 3 is a diagram of a multi-mode wireless communications device 110 employing a unique oscillator synchronization circuit 112 to facilitate handoff between digital communications systems. The construction of the communications device 110 is similar to the construction of the communications device 40 of FIG. 2 with the exception that the first frequency tuner 52 and second frequency tuner 64 of FIG. 2 are replaced by a system frequency tuner 114 and the frequency synchronizer 112, which facilitate handoff between different digital systems. In addition, different software is installed in the system controller/computer 56 to account for the different circuitry.

The system frequency tuner 114 is connected to an output of the first receive chain 44, to an output of the first oscillator 60, to an output of the second receive chain 46, to an input of the first oscillator 60, to an input of the second oscillator 68, to the system controller/computer 56, and to an output of the frequency synchronizer 112. The frequency synchronizer 112 is connected to an output of the first oscillator 60, to an input of the first oscillator 60, to an output of the second oscillator 68, to an input of the second oscillator 68, to an output of the system controller/computer 56, and to an input of the system frequency tuner 114.

In the present specific embodiment, the first receive chain 44, the transmit chain 48, the first frequency synthesizer 62, the first oscillator 60, and the first communications circuit 54 are adapted for CDMA communications signals. The second receive chain 46, the second transmit chain 50, the second frequency synthesizer 70, the second oscillator 68, and the second communications circuit 66 are adapted for GSM communications signals.

In operation, when the device 110 is turned on, and the first receive chain 44 initially receives a CDMA signal, the system frequency tuner 114 tunes the first oscillator 60 in accordance with the frequency indicated via the received CDMA signal. The system frequency tuner 114 may be adjusted and controlled via the system controller/computer 56.

The output of the first oscillator 60 is provided to the frequency synchronizer 112. The frequency synchronizer 112 uses output from the first oscillator 60 to tune the second oscillator 68 to be at or near the predetermined desired GSM frequency for which the second receive chain 46 and the second transmit chain 50 will be employed. The frequency synchronizer 112 is periodically activated via a control signal from the system controller/computer 56 and periodically tunes the second oscillator 68 in response thereto. The frequency synchronizer 112 receives the output from the second oscillator 68, which enables the frequency synchronizer 112 to compare the existing frequency of the second oscillator 68 with the frequency of the signal output from the first oscillator 60 and to generate an oscillator control or reference signal that is provided to the second oscillator 68 in response thereto.

The frequency synchronizer 112 uses the output from the first oscillator 60 to tune the second oscillator 68 to be at or near the predetermined desired GSM frequency for which the second receive chain 46 and the second transmit chain 50 will be employed. The frequency synchronizer 112 is periodically activated via a control signal from the system controller/computer 56 and periodically tunes the second oscillator 68 in response thereto.

The desired frequency output from the second oscillator 68 has a predetermined relationship to the frequency of the signal output from the first oscillator 60. When the wireless phone 110 is operating in a CDMA coverage area, the first oscillator 60 is tuned to a received CDMA signal via the system frequency tuner 114 and a CDMA signal received via the first receive chain 44. Subsequently, the second oscillator 68 is tuned to a desired GSM frequency based on the output frequency of the first oscillator 60 and the predetermined relationship between the desired frequency of the second oscillator 68 and the output frequency of the first oscillator 60. Hence, any oscillator frequency drift or error associated with the second oscillator 68 is reduced or eliminated before the device 110 is handed off to a GSM system. This greatly facilitates and expedites intersystem handoff.

In the preferred embodiment, the frequency synchronizer 112 counts a predetermined number of cycles of the signal output from the first oscillator 60, which corresponds to a given time interval, and counts the number of cycles of the signal output from the second oscillator 68 occurring in the given time interval. The given time interval is the time required for a counter, as discussed more fully below, to count a specific number of cycles of the signal output from the first oscillator 60, where the specific number of cycles corresponds to a first desired count or frequency. If the first oscillator 60 is locked onto a received CDMA signal, the first desired count is proportional to the frequency of the signal output from the first oscillator 60, where the constant of proportionality depends on the given time interval, which depends on the predetermined number of cycles of the output of the first oscillator 60. For example, if the given time interval is 1 second, then the first desired count is equivalent to the frequency of the signal output from the first oscillator 60.

The difference between the number of cycles of the signal output from the second oscillator 68 in a given time interval and a desired number of cycles occurring in the given time interval is provided as a control signal or reference signal to the second oscillator 68, where the given time interval is established via the currently locked-on oscillator 60 or 68, which in the present example is the first oscillator 60. The desired number of cycles corresponds to a second desired count (desired count 2).

If the second oscillator 68 is locked onto a received signal, which is a GSM signal in the present specific embodiment, desired count 2 is determined by the system controller/computer 56 and provided to the frequency synchronizer 112. Desired count 2 corresponds to a desired number of cycles of the output of the second oscillator 68 occurring during a predetermined number of cycles of the output of the first oscillator 60. If the predetermined number of cycles of the output of the first oscillator 60 is $19.68 \times 10^6$ (which corresponds to a time interval of 1 second), then the desired count 2 is 13.00 MHz.

In an alternative embodiment, the different counts (desired count 1 and desired count 2) are divided to yield a ratio that is compared to a predetermined desired ratio, i.e., 13/19.68 to yield a control signal or reference signal that is provided to the first oscillator 60. The second oscillator 68 contains circuitry (not shown) to accommodate the control signals and reference signals output from the frequency synchronizer 112 and the system frequency tuner 114. The first oscillator contains circuitry (not shown) to accommodate the control signals or reference signals output from the system frequency tuner 114. Such circuitry may be constructed by one skilled in the art with access to the present teachings.

The frequency synchronizer 112 adjusts the reference frequency input to the second oscillator 68 to account for frequency error associated with the second oscillator 68 when the first oscillator 60 is locked onto a received signal or when the second oscillator 68 is locked onto a received signal. Once the first oscillator 60 and the second oscillator 68 are tuned relative to each other via the frequency synchronizer 112, the system frequency tuner 114 uses a received signal from either the first receive chain 44 and/or the second receive chain 46 to tune both oscillators 60 and 68

If a GSM system is currently active and communicating with the device 110, the second oscillator 68 is active, and the output of the second oscillator 68 is tuned in accordance with a predetermined desired relationship (13/19.68) between the output frequency of the first oscillator 60 and the output frequency of the second oscillator 68. Subseqeuntly, the system freqeuncy tuner 114 adjusts both the freqeuncy of the first oscillator 60 and the freqeuncy of the second oscillator 68 based on the freqeuncy indicated via the output of the second receive chain 46.

Slight modifications in software or hardware required to accommodate each implementation of the present invention are easily performed by one ordinarily skilled in the art with access to the present teachings. In addition, those skilled in the art will appreciate that the separate transmit and receive chains 44, 48, 46, and 50 of the communications device 110 may be replaced by a single transmit chain and a single receive chain that employ tunable filters and circuitry so that they may be quickly and easily adapted, such as by software running on the system controller/computer 56, to accommodate the GSM or the CDMA system as needed. In addition, the oscillators 60 and 68 may be replaced by other types of frequency sources such as a combination of tunable phase-locked loops (PLLs) and/or direct digital synthesizers (DDSs), and a master reference frequency source without departing from the scope of the present invention.

In a preferred embodiment, the predetermined relationship between the frequency of the first oscillator 60 and the frequency of the second oscillator 68 is proportional to the difference (measured count 2 as discussed more fully below) between a measured number of cycles of the output of second oscillator 68 occurring during a given time interval and a desired difference (desired count 2 as discussed more fully below). The given time interval is measured via the output of the first oscillator 60. For example, if the first oscillator 60 is tuned to a CDMA frequency of 19.68 MHz and if the given time period is approximately 1 second, which is measured by counting approximately $19.68 \times 10^6$ cycles of the output of the first oscillator 60, then the number of cycles of the output of the second oscillator 68 occurring during the measured 1 second interval is counted (measured count 2). The desired number of cycles (desired count 2) of the output of the second oscillator 68 is $13.00 \times 10^6$ cycles, which corresponds to a desired GSM frequency. The difference between the desired count ($13.00 \times 10^6$ cycles), as provided by the system controller/computer 56 to the frequency synchronizer 112, and the actual measured count of the number of cycles of the output of the second oscillator 68 occurring during the given time interval (1 second) is input to the second oscillator 68 as a frequency control signal (desired count 2—measured count 2). The exact format of the control signal is application-specific and depends on the types of oscillators employed. Those skilled in the art will know how to format the control signal to meet the needs of a given application.

Once the first oscillator 60 and the second oscillator 68 are tuned relative to each other via the frequency synchronizer 112, the system frequency tuner 114 can use a received signal from either the first receive chain 44 and/or the second receive chain 46 to tune both oscillators 60 and 68. As a result, both oscillators 60 and 68 are easily tuned when the device 110 is in either a GSM or CDMA mode, thereby allowing for efficient handoffs between communications systems without degraded performance or dropped handoffs due to the inactive system's oscillator not being properly tuned.

Hence, the frequency synchronizer 112 employs an efficient method for tuning the oscillator 60 or 68 that is not locked-on to a received signal to be close to that of the associated communications system frequency. For example, if the active system is a CDMA system and the first oscillator 60 is locked onto the received CDMA signal, the second oscillator 68 is tuned via the frequency synchronizer 112 to be at or near the desired frequency associated with the second communications system, i.e., the GSM system.

Those skilled in the art will appreciate that the separate transmit and receive chains 44, 48, 46, and 50 of the communications device 110 may be replaced by a single transmit chain and a single receive chain that employ tunable filters and circuitry so that they may be quickly and easily adapted, such as by software running on the system controller/computer 56, to accommodate the GSM or the CDMA system as needed. In addition, the oscillators 60 and 68 may be replaced by other types of frequency sources such as a combination of tunable phase-locked loops (PLLs) and/or direct digital synthesizers (DDSs), and a master reference frequency source without departing from the scope of the present invention.

Figure 4:
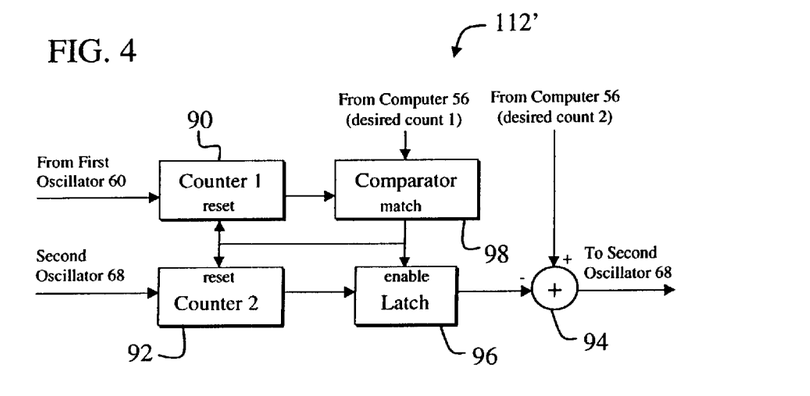
FIG. 4 is a more detailed diagram of a preferred embodiment of the frequency synchronizer of FIG. 3.

FIG. 4 is a more detailed diagram of a preferred embodiment 112' of the frequency synchronizer 112 of FIG. 3. With reference to FIGS. 3 and 4, the synchronizer 112' includes a first counter 90, a second counter 92, a latch 96, a comparator 98, and a subtractor 94. An input of the first counter 90 is connected to an output of the first oscillator 60, to an input of a comparator 98, and to an output of the comparator 98. An input of the second counter 92 is connected to an output of the second oscillator 68, to a first input of the latch 96, and to an output of the comparator 98. The comparator 98 is connected to an output of the first counter 90, to a second input of the latch 96, and to an output of the system controller/computer 56, which provides a signal representative of the first desired count. A first input of the latch 96 is connected to an output of the second counter 92, and an output of the latch 96 is connected to a negative terminal of the subtractor 94. A positive terminal of the subtractor 94 is connected to an output of the system controller/computer 56, which provides the second desired count as input to the subtractor 94.

In operation, the first counter 90 counts the number of cycles occurring in the output of the first oscillator 60 until the number of cycles matches the first desired count as indicated by a match signal output from the comparator 98. The match signal resets the values in the first counter 90 and the second counter 92 and latches the value that is stored in the second counter 92 by enabling the latch 96 before the second counter 92 is reset.

Those skilled in the art will appreciate that when employing asynchronous logic, a delay element (not shown) is included at the input of the second counter 92 so that the match signal output from the comparator 98 does not cause a latching of a 0 from the output of the second counter 92 as a result of the second counter 92 being reset before its output is latched by the latch 96. The delay element is not required when employing synchronous logic as preferably employed by the present invention to implement the frequency synchronizer 112'.

If the frequencies of the first oscillator 60 and the second frequency synthesizer 70 are properly synchronized, the output of the latch 96 will match the second desired count and the output of the subtractor 94 will be zero. Otherwise, the output of the subtractor 94 will be a positive or negative value, which represents an error signal.

For example, if the first oscillator 60 is locked-on to a received signal, then the second oscillator 68 is synchronized relative to the first oscillator 60. In this case, the output of the subtractor 94 will be an error signal proportional to the frequency error of the output of the second oscillator 68. For example, if the error signal is negative, then the frequency associated with the second oscillator 68 is too high and should be reduced by an amount proportional to the error signal. This frequency reduction is performed by the tunable second oscillator 68 in response to the receipt of a control signal corresponding to the output of the subtractor 94. The tunable features of the second oscillator 68 may be implemented in software or hardware by one ordinarily skilled in the art and having access to the present teachings.

The output of the subtractor 94 represents an error signal employed by the second oscillator 68 to adjust the frequency of the second oscillator 68 based on the error signal. The second oscillator 68 adjusts the frequency output from the second oscillator 68 so that the error signal output from the subtractor 94 goes to zero. The error signal output from the subtractor 94 corresponds to the first control signal discussed above.

Figure 5:
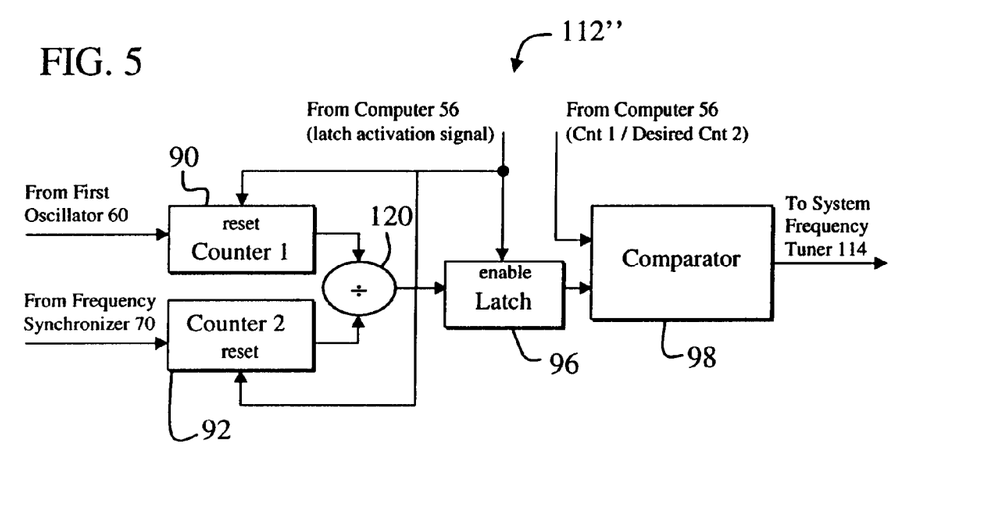
FIG. 5 is a more detailed diagram of an alternative embodiment the frequency synchronizer of the wireless communications device of FIG. 3.

FIG. 5 is a more detailed diagram of the alternative embodiment 112" of the frequency synchronizer 112 of FIG. 3. With reference to FIGS. 3, 4, and 5, the frequency synchronizer 112" is similar to the frequency synchronizer 112' of FIG. 4 with the exception that the outputs of the first counter 90 and the second counter 92 are connected to inputs of a divider 120, an output of which is connected to a first input of the latch 96; a second input of the latch 96 is connected to an output of the system controller/computer 56, which is also connected to reset inputs of the fist counter 90 and the second counter 92; and a first input of the comparator 98 is connected to an output of the latch 96, and a second input of the comparator 98 is connected to a desired ratio as provided from the system controller/computer 56 of FIG. 3. An output of the comparator 98 provides the first control signal to the frequency tuner 114, which runs additional hardware or software algorithms to incorporate the first control signal into appropriate oscillator control signals.

The control signal received by the comparator 98 from the system controller/computer 56 is representative of a desired ratio (13.00/19.68) between the outputs of the first counter 90 and the second counter 92. The desired ratio is compared to the measured ratio as output from the latch 96 via the divider 120 to yield the first control signal that is input to the system frequency tuner 114. The comparator 98 may be implemented as a divider or a subtractor or another circuit depending on the signal formatting needs of a given application.

With access to the present teachings, those ordinarily skilled in the art can easily build and implement or order requisite components of the present invention including software running on the system controller/computer 56, the frequency synchronizers 82 and 112, transmit and receive chains 44, 48, 50, and 56, counters 90 and 92, latches 96, comparators 98, and the communications circuits 54 and 66.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A system for synchronizing a second receive chain relative to a first receive chain in a multi-mode communication system comprising:

first means for determining a first frequency associated with said first receive chain;

a first frequency synthesizing means for producing a first signal having the first frequency;

a second frequency synthesizing means for producing a second signal having a second frequency associated with the second receive chain; and second means for adjusting the second frequency by providing a frequency control signal for adjusting the second frequency to the second frequency synthesizing means, wherein the frequency control signal is based on a predetermined relationship between the first frequency and the second frequency.

2. The system of claim 1 wherein the first frequency synthesizing means includes a first oscillator, the second frequency synthesizing means includes a second oscillator, and the frequency control signal adjusts the output of the second oscillator.

3. The system of claim 1 wherein said second means includes means for generating said frequency control signal based on a difference between said second frequency and said first frequency, said first frequency corresponding to a first count of the number of cycles occurring in the first signal during a time interval, and said second frequency corresponding to a second count of the number of cycles occurring in the second signal.

4. The system of claim 3 wherein the frequency control signal is based on a difference between a predetermined number of cycles and an actual number of cycles in a signal outputted by the second oscillator measured during the time interval.

5. The system of claim 4 wherein said second means includes a subtractor for calculating the difference.

6. The system of claim 5 wherein said second means includes a frequency tuner for adjusting the outputs of the first and second oscillators.

7. The system of claim 1 wherein the predetermined relationship is based on a ratio of said first frequency to said second frequency and a predetermined desired ratio of said first frequency to said second frequency.

8. The system of claim 7 wherein said second means includes means for generating said frequency control signal based on a comparison of a ratio between said first frequency and said second frequency and the predetermined desired ratio between said first frequency and said desired second frequency.

9. A wireless communications device accommodating more than one digital communications system standards comprising:

first means for receiving a first signal formatted in accordance with a first digital communications standard, said first means synchronized to a first frequency;

second means for receiving a second signal formatted in accordance with a second digital communications standard, said second means synchronized to second frequency; and third means for adjusting said second frequency to a desired second frequency in response to a measurement of said first frequency to facilitate the reception of said second signal by said second means, wherein the third means provides a frequency control signal to the second means to adjust the second frequency, and the frequency control signal is based on a predetermined relationship between the first frequency and the second frequency.

10. The system of claim 9 wherein said first means includes a first transceiver section.

11. The system of claim 9 wherein said second means includes a second transceiver section.

12. The system of claim 9 wherein said third means includes a frequency synchronization circuit having a first counter for measuring said first frequency and a second counter for measuring said second frequency.

13. The system of claim 12 wherein said third means includes means for adjusting said second frequency in response to a lock-on to said first signal by said first means.

14. The system of claim 12 wherein said third means includes means for employing an output of said first counter and an output of said second counter to provide the frequency control signal indicative of a difference between said second frequency and said desired second frequency.

15. The system of claim 14 wherein said second means further includes means for changing said second frequency to said desired second frequency in response to said frequency control signal.

16. The system of claim 15 wherein said means for employing includes means for computing a ratio of said first frequency and said second frequency.

17. The system of claim 16 wherein said means for employing includes means for comparing said ratio to a predetermined ratio of said desired second frequency and said first frequency and providing said frequency control signal in response thereto.

18. A wireless communications device accommodating more than one digital communications system standards comprising:

a first receiver for receiving a first signal formatted in accordance with a first digital communications standard, said first means synchronized to a first frequency;

a second receiver for receiving a second signal formatted in accordance with a second digital communications standard, said second means synchronized to second frequency; and a frequency control circuit for adjusting said second frequency to a desired second frequency in response to a measurement of said first frequency to facilitate the reception of said second signal by said second means, wherein the frequency control circuit provides a frequency control signal to the second receiver to adjust the second frequency, and the frequency control signal is based on a predetermined relationship between the first frequency and the second frequency.

\* \* \* \* \*